United States Patent [19]

Coburn, Jr.

[11] 4,292,959
[45] Oct. 6, 1981

[54] SOLAR ENERGY COLLECTION SYSTEM
[75] Inventor: John F. Coburn, Jr., Cranford, N.J.
[73] Assignee: Exxon Research & Engineering Co., Florham Park, N.J.
[21] Appl. No.: 124,278
[22] Filed: Feb. 25, 1980
[51] Int. Cl.³ .......................... F24J 3/02; G01J 1/00; G02B 17/00
[52] U.S. Cl. ................................. 126/438; 126/417; 126/439; 250/458; 250/487; 250/228; 350/262; 350/265
[58] Field of Search ............... 126/417, 421, 438, 439, 126/449, 900; 250/458, 459, 487, 228, 227; 362/32, 84; 350/262, 265, 258

[56] References Cited
U.S. PATENT DOCUMENTS 4,149,902 4/1979 Mauer ................................. 250/458
4,201,197 5/1980 Dismer ................................ 126/439

Primary Examiner—Samuel Scott
Assistant Examiner—G. Anderson
Attorney, Agent, or Firm—Joseph J. Dvorak

[57] ABSTRACT

A system is provided for the collection of electromagnetic radiation and the transmission of that radiation to a point of utilization in the form of light. Basically, the system employs a first solar concentrator for the collection and concentration of solar radiation. Optically coupled to the first solar concentrator is at least one additional solar concentrator for further concentrating the collected solar radiation for efficient coupling with a light pipe. Thus, the light pipe directs the collected and concentrated light to a point of utilization. Preferably, the solar concentrators are planar fluorescent solar concentrators having different fluorescent materials in each concentrator.

8 Claims, 6 Drawing Figures

SOLAR ENERGY COLLECTION SYSTEM

FIELD OF THE INVENTION

This invention relates to a system for collecting solar energy, concentrating it and transmitting it to a point of use in the form of light.

BACKGROUND OF THE INVENTION

Commercially available solar collectors typically convert solar radiation incident on a generally wide area to electrical or thermal energy which is subsequently transported in the converted form to a point of use. Because of some of the inherent practical and technical limitations of large area solar conversion devices, attempts have been made to concentrate the solar radiation impinging over a wider area and focusing it onto a smaller area conversion device. Among the typical solar energy concentrators employed are mirrors, lenses and fluorescent devices.

In U.S. Pat. No. 668,404, use of a mirror for focusing solar radiation onto a point of use is disclosed. A more recent solar concentrator based on the use of reflecting solar radiation with mirrors and focusing it at a collection point is disclosed in U.S. Pat. No. 4,130,109. Since the relative position of the sun and earth changes with time, there are certain practical limitations with respect to using mirrored surfaces for focusing solar radiation at a point of use.

In U.S. Pat. No. 4,148,300 and U.S. Pat. No. 4,114,592, lens type devices are disclosed for focusing solar radiation on a point of use. As undoubtedly will be appreciated, high quality lenses for such applications are expensive and consequently are not suitable to extremely widespread use.

In U.S. Pat. No. 4,175,980 and U.S. Pat. No. 4,149,902, there are described different types of fluorescent concentrators in which solar radiation is collected over large flat areas and focused onto a smaller area for the photovoltaic conversion of the focused radiant energy by means of a photovoltaic device. Indeed, in U.S. Pat. No. 4,149,902, the photovoltaic device is contiguous with the fluorescent collector. In one embodiment of U.S. Pat. No. 4,175,980, however, the photovoltaic device is not contiguous with the fluorescent concentrator but is separated from the concentrator by means of a fiber optic mechanism. In the former patent, however, the amount of light utilized is limited by the cross-sectional area of the solar cell and, in the latter patent, the amount of light utilized is limited by the cross-sectional area of the fiber optic mechanism.

SUMMARY OF THE INVENTION

According to this invention, there is provided a system for the collection of electromagnetic radiation and the transmission of that radiation to a point of utilization in the form of light. Basically, the system employs a first solar concentrator for the collection and concentration of solar radiation. Optically coupled to the first solar concentrator is at least one additional solar concentrator for further concentrating the collected solar radiation for efficient coupling with a light pipe. Thus, the light pipe directs the collected and concentrated light to a point of utilization. Preferably, the solar concentrators are planar fluorescent solar concentrators having different fluorescent materials in each concentrator.

The precise characteristics and features of the invention will become more readily apparent from the following detailed description when read in light of the accompanying drawings.

DETAILED DESCRIPTION OF THE INVENTION

Figure 1:
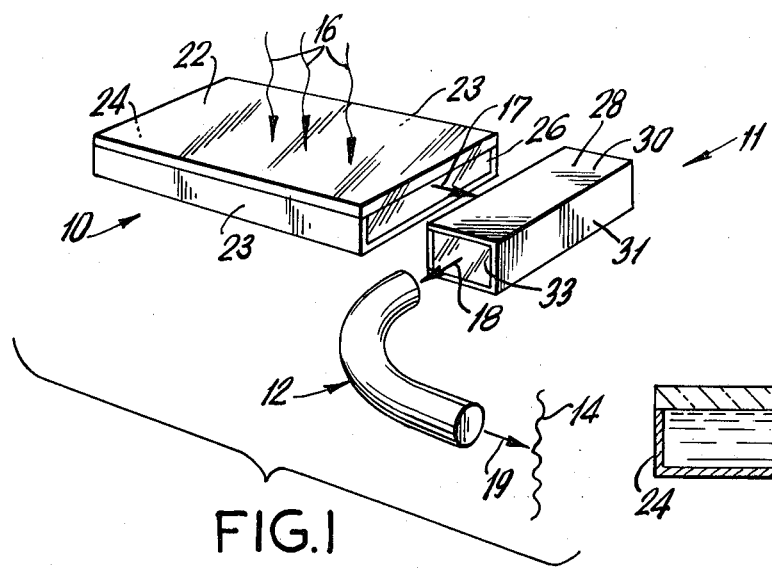
FIG. 1 is a schematic isometric drawing of one embodiment of the present invention.

Turning now to FIG. 1, the system for the collection of solar radiation and its transmission to a point of utilization according to the present invention includes a solar energy receiver 10 optically coupled to means 11 for further concentrating the collected solar radiation and transmitting it to a light transmission pipe 12 for transmission to a point of use designated generally as 14.

In operation, incident solar radiation designated by line 16 is received in the collector 10 and concentrated and transmitted as shown by line 17 to the second stage concentrator 11 where the light is further concentrated and transmitted as shown by line 18 to light pipe 12. The light emanating from light pipe 12 and shown generally as line 19 is delivered to a point of utilization 14.

Figure 3:
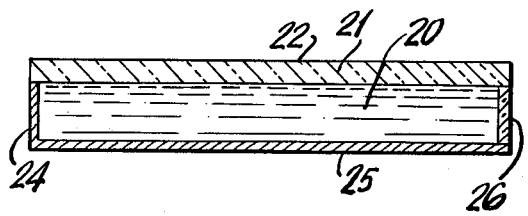
FIG. 3 is a sectional view taken along lines 3—3 of FIG. 2.
Figure 2:
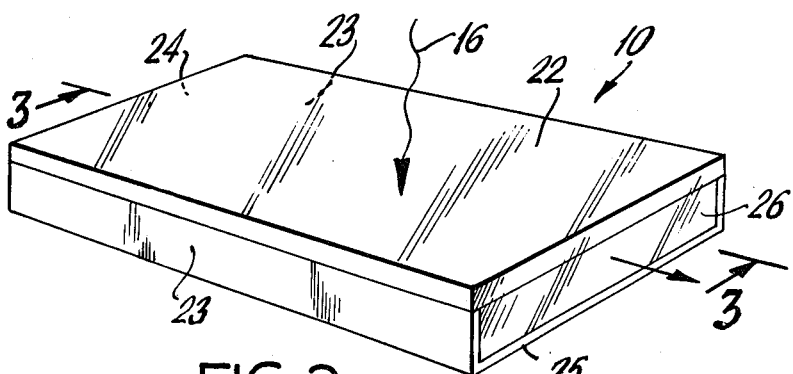
FIG. 2 is a schematic illustration of a fluorescent planar concentrator useful in the solar system of the present invention.

Basically, the solar energy receiver 10 can be any one of the known devices for the reception of incident solar radiation and its concentration such as planar concentrators, mirrored reflectors, parabolic troughs, and the like. In the practice of the present invention, however, it is particularly preferred that the solar collector 10 be a fluorescent planar concentrator. These fluorescent planar concentrators are known in the art. They consist, for example, of layers of dyes on light transparent slabs of material or consist of glass containing fluorescent chelates, certain inorganic ions and the like. Thus, as is shown in FIG. 3, for example, solar collector 10 consists of a layer of fluorescent material 20 which is optically coupled to a sheet of highly light transparent material 21 such as glass or plastic. Thus, the collector 10 has a major surface 22 for the reception of incident solar radiation. The side walls 23 and end wall 24 are preferably coated with a light reflecting material, such as aluminum, silver and the like. Also, bottom surface 25 is coated with a light diffusive material such as white paint and, preferably, a light reflective material. Thus, as can be seen in FIGS. 1 and 2, the incident solar radiation 16 is internally reflected by means of the mirrors on light reflective surfaces and the fluorescent material 20 and is redirected so as to exit the collector at unmirrored end wall 26.

Figure 5:
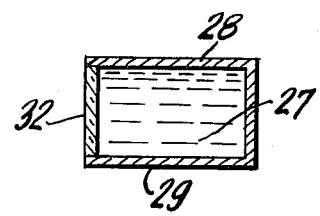
FIG. 5 is a sectional view taken along lines 5—5 of FIG. 4.
Figure 4:
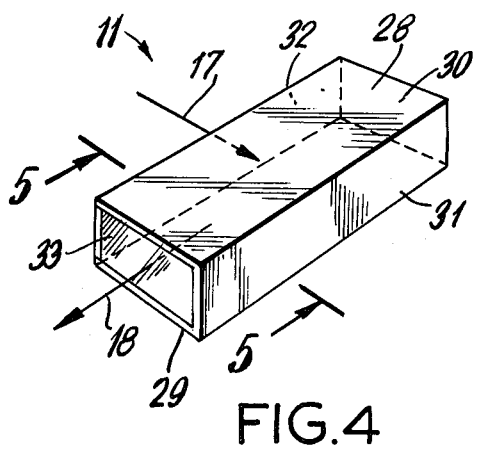
FIG. 4 is a schematic illustration of one connector device used in the system of the present invention.

As can be seen in FIG. 1, optically connected to end wall 26 of solar collector 10 is connector means 11 for optically connecting the first stage concentrator to a light pipe. The connector 11 also further concentrates the solar radiation as well as serves to transmit it to the light pipe 12. Basically, the connector means 11 for further concentrating the solar radiation is a second stage concentrator which may be based upon reflectors, parabolic troughs and the like, but preferably the second stage solar concentrator is a fluorescent planar concentrator (see FIGS. 4 and 5) consisting largely of a fluorescent material 27 having light reflective surfaces on the top and bottom 28 and 29 of the concentrator, respectively, as well as end wall 30 and side wall 31. The fluorescent material of the second stage concentrator, of course, must be a different fluorescent material from the fluorescent material in the first fluorescent concentrator, i.e., it must absorb solar radiation in a different region of the spectrum. Both concentrators may employ dyes, chelates or inorganic ions, however.

Returning to FIGS. 1 and 4, connector means 11 has a side wall 32 which is adapted to be optically coupled to the edge of collector concentrator 10 for the reception of solar radiation from collector 10 for further concentration in connector 11. The connector or second stage concentrator additionally has an unmirrored side wall 33 for optical coupling to a light transmission pipe 12.

Figure 6:
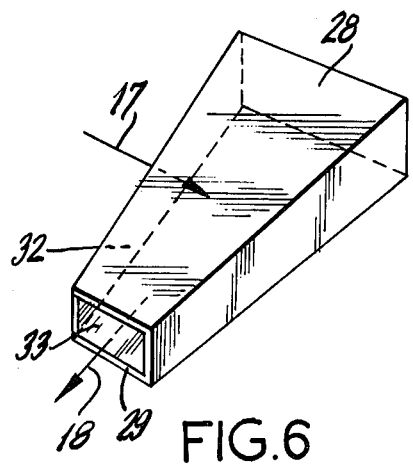
FIG. 6 is a schematic illustration of yet another connector device used in the practice of the present invention.

In the embodiment shown in FIG. 6, the second stage concentrator has a geometry designed to enhance the concentration being achieved via the fluorescent mechanism thereby further reducing the area for light to be emitted-from for coupling to the light pipe 12.

As will be appreciated, the light transmission pipe 12 or optical waveguide is one which is normally employed in conventional fiber optic techniques and, indeed, would typically be a plurality of such fibers. However, a single conventional light pipe may be used in the practice of the present invention.

As is indicated in FIG. 1, 14 represents a point of utilization. As will be readily appreciated, the light emanating from light pipe 12 and shown as line 19 can be projected onto a photoresponsive device such as a photovoltaic cell for direct conversion of the light incident on the cell to electrical energy. Optionally and preferably, the point of utilization will include a heat exchanger having a selective surface thereon for converting fluid in heat exchange relationship with the heat exchanger to thermal energy.

As will be readily appreciated, control means (not shown) can be employed to switch the light at the point of use so as to limit the amount of thermal energy generated in the thermal conversion device or the temperature reached when power is not required.

The invention has been described in detail with particular reference to preferred embodiments thereof, but it will be understood that reasonable variations and modifications are possible without departing from the spirit and scope of the invention.

What is claimed is:

1. A system for the collection of solar radiation and the transmission thereof to a point of utilization in the form of light comprising:
   a solar collector for the receipt and concentration of solar radiation, said solar collector being a planar fluorescent concentrator having a major surface for receipt of instant solar radiation and an edge for transmission of the solar radiation collected and concentrated by said collector;
   second concentrator means optically coupled to said edge of said collector for receipt of concentrated solar radiation from said collector and for the further concentration of said solar radiation;
   a light transmission pipe optically connected to said second concentrator, whereby light from the collector which is concentrated in the second concentrator is introduced into said light transmission pipe for transmission to a point of use; and,
   a utilization device remote from said solar collector whereby solar radiation incident on said collector is transmitted to said point of utilization in the form of light.

2. The system of claim 1, wherein the connector is a planar fluorescent concentrator in which the fluorescent material is different from the fluorescent material in the collector.

3. The device of claim 2, wherein the light pipe comprises a plurality of optical waveguides.

4. The device of claim 3, wherein the point of utilization comprises a photovoltaic device.

5. The device of claim 3, wherein the utilization device includes a heat exchange surface for conversion of the light incident on that surface to thermal energy.

6. A solar energy system comprising:
   a first planar fluorescent solar concentrator, said planar concentrator having a major surface for collection and concentration of incident solar radiation, said concentrator having an end edge for transmission of said collected solar radiation;
   a second planar fluorescent solar concentrator optically coupled to said first planar concentrator for receipt of solar radiation transmitted by said first concentrator, said second planar fluorescent concentrator having an end edge for transmission of said solar radiation;
   a light transmission pipe optically coupled to said second planar concentrator for receipt of solar radiation and transmission thereof to a point of use; and,
   a utilization device remote from said first and second collectors whereby solar radiation incident on said point of utilization in the form of light.

7. The device of claim 6, wherein the utilization device includes a heat exchange surface for conversion of light on that surface to thermal energy.

8. The device of claim 6, wherein the utilization device includes a photoresponsive surface for the conversion of light to electrical energy.

* * * * *

UNITED STATES PATENT AND TRADEMARK OFFICE
CERTIFICATE OF CORRECTION

PATENT NO. : 4,292,959
DATED : October 6, 1981
INVENTOR(S) : John F. Coburn, Jr.

It is certified that error appears in the above—identified patent and that said Letters Patent is hereby corrected as shown below:

Claim 1, line 7, change "instant" to --incident--.

Signed and Sealed this

Twenty-third Day of February 1982

[SEAL]

Attest:

GERALD J. MOSSINGHOFF

Attesting Officer

Commissioner of Patents and Trademarks